(12) United States Patent
Kim et al.

(10) Patent No.: US 11,054,888 B2
(45) Date of Patent: Jul. 6, 2021

(54) POWER GATING CIRCUIT AND POWER GATING CONTROL SYSTEM

(71) Applicant: SK hynix Inc., Icheon-si (KR)

(72) Inventors: Woongrae Kim, Icheon-si (KR); Yoo Jong Lee, Suwon-si (KR); Tae Yong Lee, Seoul (KR)

(73) Assignee: SK hynix Inc., Icheon-si (KR)

(*) Notice: Subject to any disclaimer, the term of this patent is extended or adjusted under 35 U.S.C. 154(b) by 134 days.

(21) Appl. No.: 16/167,202

(22) Filed: Oct. 22, 2018

(65) Prior Publication Data

US 2019/0278359 A1    Sep. 12, 2019

(30) Foreign Application Priority Data

Mar. 12, 2018  (KR) .................. 10-2018-0028566

(51) Int. Cl.

| | | |
|---|---|---|
| *G06F 1/3287* | (2019.01) | |
| *G06F 1/324* | (2019.01) | |
| *H03K 19/00* | (2006.01) | |
| *G05F 3/02* | (2006.01) | |
| *G06F 1/28* | (2006.01) | |
| *G06F 1/3296* | (2019.01) | |

(52) U.S. Cl.
CPC .............. *G06F 1/3287* (2013.01); *G05F 3/02* (2013.01); *G06F 1/324* (2013.01); *H03K 19/0013* (2013.01); *H03K 19/0027* (2013.01); *G06F 1/28* (2013.01); *G06F 1/3296* (2013.01)

(58) Field of Classification Search
CPC .............. H03K 19/0016; H03K 17/687; H03K 2005/00065; G06F 2119/06; G06F 30/20; G06F 30/30; G06F 1/3287; Y02D 10/171

USPC .......... 713/322, 324; 257/E23.153, E23.079, 257/691; 325/33, 93

See application file for complete search history.

(56) References Cited

U.S. PATENT DOCUMENTS

| | | | |
|---|---|---|---|
| 6,748,545 B1* | 6/2004 | Helms ....................... | G06F 1/26 713/300 |
| 8,072,237 B1* | 12/2011 | Rahim ............. | H03K 19/17784 326/39 |
| 8,451,039 B2* | 5/2013 | Myers ................ | G11C 14/0054 327/202 |
| 8,648,654 B1* | 2/2014 | Myers ................ | H03K 19/0016 327/565 |
| 9,310,878 B2 | 4/2016 | Watanabe et al. | |

(Continued)

FOREIGN PATENT DOCUMENTS

| | | |
|---|---|---|
| KR | 1020080014531 A | 2/2008 |
| KR | 1020080077799 A | 8/2008 |

*Primary Examiner* — Faisal M Zaman
(74) *Attorney, Agent, or Firm* — William Park & Associates Ltd.

(57) ABSTRACT

A power gating circuit is provided. The power gating circuit includes a logic gate group. The power gating circuit also includes a first switching circuit coupled to first and second supply voltages and the logic gate group. The power gating circuit further includes a second switching circuit coupled to the first and second supply voltages and the logic gate group. The first and second supply voltages are supplied to the logic gate group through the first switching circuit based on a voltage select signal. The first and second supply voltages are supplied to the logic gate group through the second switching circuit based on the voltage select signal and a power down signal.

17 Claims, 6 Drawing Sheets

(56) References Cited

U.S. PATENT DOCUMENTS

| | | | |
|---|---|---|---|
| 9,698,771 B1* | 7/2017 | Srinivasan | G06F 1/24 |
| 2004/0059528 A1* | 3/2004 | Sutardja | H03H 11/30 |
| | | | 702/65 |
| 2006/0198198 A1* | 9/2006 | Fujita | G11C 5/147 |
| | | | 365/185.23 |
| 2008/0307240 A1* | 12/2008 | Dahan | G06F 1/3203 |
| | | | 713/320 |
| 2009/0089605 A1* | 4/2009 | Westwick | H03K 17/223 |
| | | | 713/340 |
| 2010/0133902 A1* | 6/2010 | Gotou | H03K 17/24 |
| | | | 307/18 |
| 2010/0141301 A1* | 6/2010 | Takeda | G11C 8/10 |
| | | | 326/105 |
| 2010/0264735 A1* | 10/2010 | Yamaoka | G06F 1/32 |
| | | | 307/43 |
| 2010/0281448 A1 | 11/2010 | He | |
| 2012/0042184 A1* | 2/2012 | Yeh | G06F 1/3203 |
| | | | 713/323 |
| 2013/0099570 A1 | 4/2013 | Manohar et al. | |
| 2013/0311799 A1* | 11/2013 | Fitzpatrick | G06F 1/3287 |
| | | | 713/320 |
| 2013/0335043 A1* | 12/2013 | He | H02M 3/3378 |
| | | | 323/234 |
| 2013/0338991 A1* | 12/2013 | Lin | G06F 30/33 |
| | | | 703/14 |
| 2014/0132329 A1* | 5/2014 | Li | H03K 3/356104 |
| | | | 327/333 |
| 2015/0135267 A1* | 5/2015 | Samorukov | G06F 11/1004 |
| | | | 726/2 |
| 2015/0229297 A1* | 8/2015 | Kwon, II | H03K 17/687 |
| | | | 327/108 |
| 2016/0162430 A1* | 6/2016 | Ma | G06F 13/385 |
| | | | 710/313 |
| 2016/0197736 A1* | 7/2016 | Shvarzberg | G06F 1/3287 |
| | | | 713/310 |
| 2016/0217848 A1* | 7/2016 | Ishizu | H01L 29/7869 |
| 2016/0257208 A1* | 9/2016 | Chong | B60L 50/50 |
| 2016/0373092 A1* | 12/2016 | Storms | G11C 16/10 |
| 2017/0063229 A1* | 3/2017 | Powell | G05F 1/59 |
| 2017/0192475 A1* | 7/2017 | Fujimoto | G06F 3/067 |
| 2018/0337676 A1* | 11/2018 | Kim | H03K 19/003 |

* cited by examiner

POWER GATING CIRCUIT AND POWER GATING CONTROL SYSTEM

CROSS-REFERENCES TO RELATED APPLICATION

The present application claims priority under 35 U.S.C. § 119(a) to Korean application number 10-2018-0028566, filed on Mar. 12, 2018, in the Korean Intellectual Property Office, which is incorporated herein by reference in its entirety.

BACKGROUND

1. Technical Field

Various embodiments generally relate to a semiconductor circuit, and more particularly, to a power gating circuit and a power gating control system.

2. Related Art

Recently, electronic devices, for example, portable electronic devices have been reduced in size and weight, but the number of function blocks mounted in the potable electronic devices has continuously increased.

In particular, since the portable electronic devices are operated by a limited power supply such as a battery, power which is unnecessarily consumed by the function blocks in a power down mode must be reduced.

For this operation, a power gating technique is applied to the portable electronic devices, in order to prevent power the unnecessary power consumption of the function blocks in the power down mode.

Therefore, there is a demand for a power gating technique which can improve the operation performance of an electronic device and is optimized to current consumption reduction.

SUMMARY

In an embodiment, a power gating circuit may be provided. The power gating circuit may include a logic gate group. The power gating circuit may include a first switching circuit coupled to first and second supply voltages and the logic gate group. The power gating circuit may include a second switching circuit coupled to the first and second supply voltages and the logic gate group. The first and second supply voltages may be supplied to the logic gate group through the first switching circuit based on a voltage select signal. The first and second supply voltages may be supplied to the logic gate group through the second switching circuit based on the voltage select signal and a power down signal.

In an embodiment, a power gating control system may be provided. The power gating control system may include a logic circuit region configured to operate according to a first or second supply voltage, and may include internal logic gates of which threshold voltages are varied according to bulk bias voltages. The power gating control system may include a mode register configured to store bulk bias voltages as code signals for the first and second supply voltages, respectively, the bulk bias voltages being optimized for threshold voltage control at operation frequencies. The power gating control system may include a command control circuit configured to determine an operation state of an electronic device and a frequency of a clock signal according to a command signal inputted from outside, and generate control signals according to the operation state and the frequency. The power gating control system may include a voltage generation circuit configured to generate a plurality of bulk bias voltages according to the code signals. The power gating control system may include a power gating control circuit configured to provide the first or second supply voltage to the logic circuit region according to the control signals, select the bulk bias voltages suitable for the logic circuit region among the plurality of bulk bias voltages, and provide the selected bulk bias voltages to the logic circuit region.

DETAILED DESCRIPTION

Hereinafter, a power gating circuit and a control system thereof according to the present disclosure will be described below with reference to the accompanying drawings through examples of embodiments.

Various embodiments may be directed to a power gating circuit capable of preventing an operation performance reduction while reducing current consumption, and a power gating control system.

Figure 1:
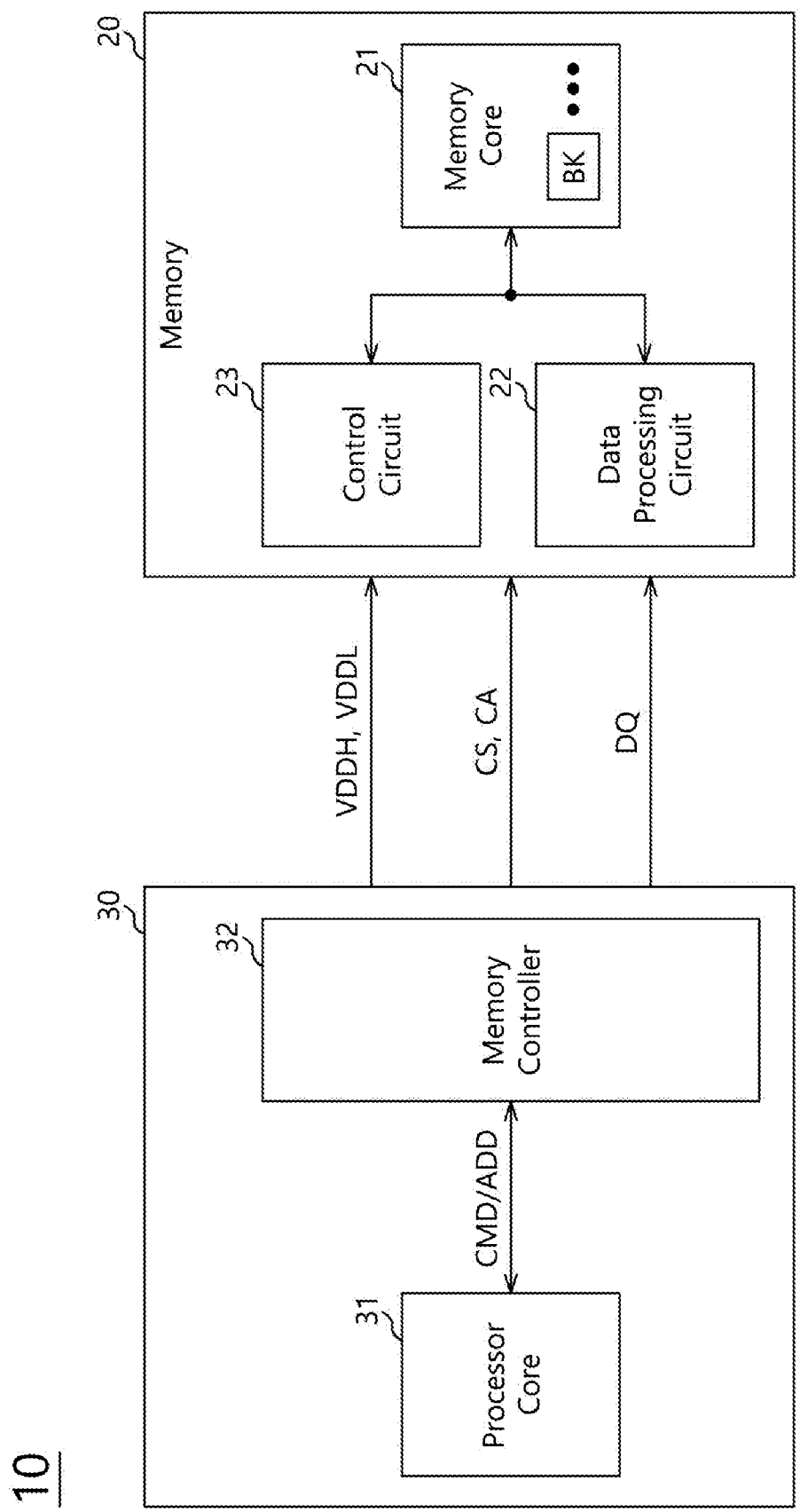
FIG. 1 illustrates the configuration of an electronic system in accordance with an embodiment.

FIG. 1 illustrates the configuration of an electronic system 10 in accordance with an embodiment.

Referring to FIG. 1, the electronic system 10 in accordance with a present embodiment may include a memory 20 and a processor 30.

The electronic system 10 may have a system-on-chip (SoC) configuration.

The processor 30 may include a central processing unit (CPU) or graphic processing unit (GPU).

The processor 30 may include a processor core 31 and a memory controller 32.

The processor core 31 may provide various commands CMD and addresses ADD for controlling the memory 20 to the memory controller 32.

The memory controller 32 may control the memory 20 by providing first and second supply voltages VDDH and VDDL, a chip select signal CS and a command/address signal CA to the memory 20 according to a command CMD and address ADD provided from the processor core 31.

The memory controller 32 may transmit and receive data DQ to and from the memory 20.

The memory 20 may include a memory core 21, a data processing circuit 22 and a control circuit 23.

The memory core 21 may include a plurality of unit memory regions, for example, memory banks BK and circuit components for data input/output of the memory banks BK.

The data processing circuit 22 may perform a data input/output-related operation between the memory core 21 and the memory controller 32.

The control circuit 23 may control a data read/write operation and power gating-related operation of the memory 20, according to the chip select signal CS and the command/address signal CA which are provided from the memory controller 32 of the processor 30.

Figure 2:
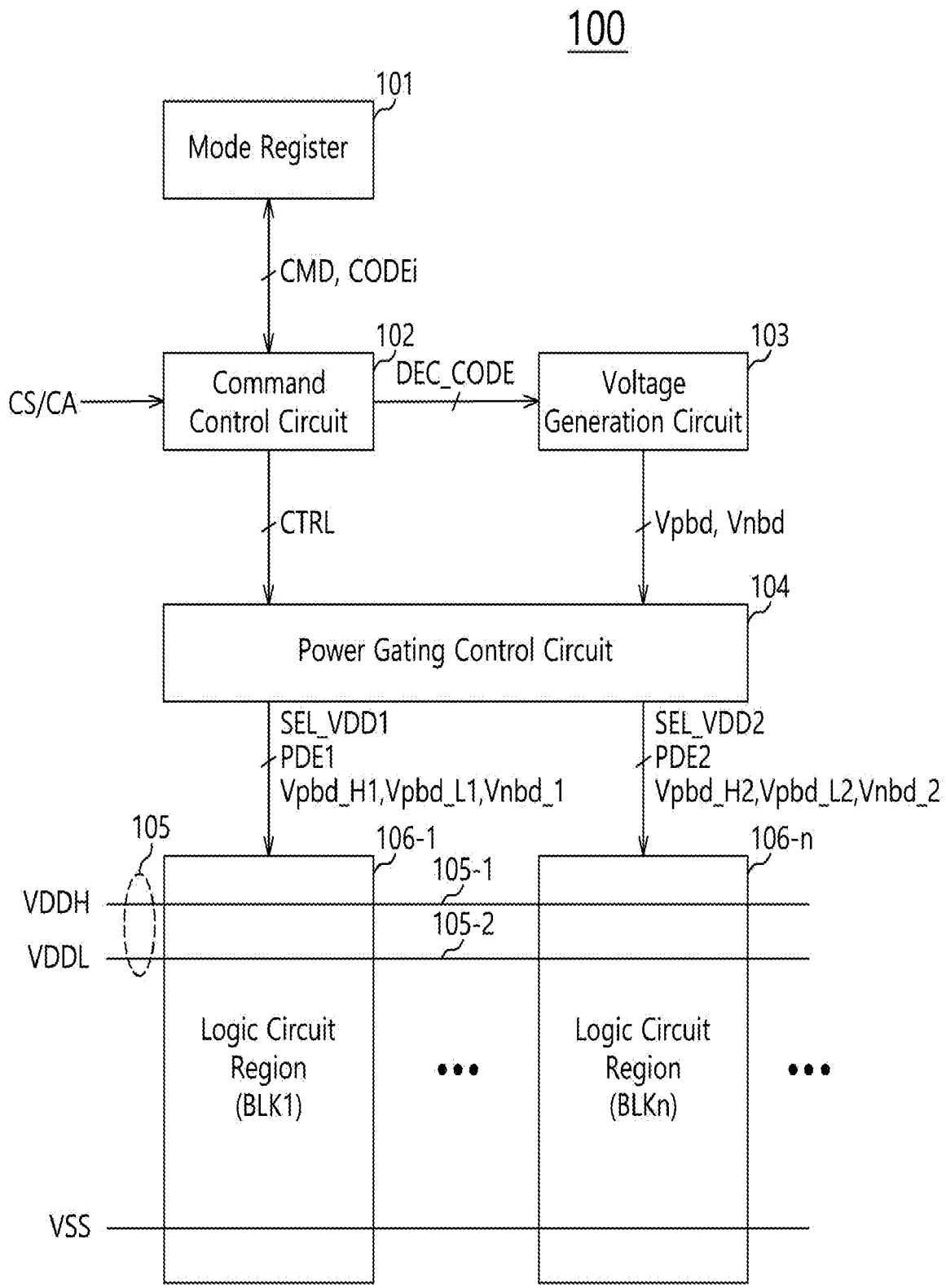
FIG. 2 illustrates the configuration of a power gating control system in accordance with a present embodiment.

FIG. 2 illustrates the configuration of the power gating control system 100 in accordance with a present embodiment.

The power gating control system 100 in accordance with a present embodiment may use dynamic voltage frequency scaling (DVFS) and zigzag power gating in combination with each other.

The DVFS may indicate a method that selectively uses supply voltages having different levels depending on operation frequencies, in order to reduce current consumption.

The zigzag power gating may indicate a method for cutting off power supply to a plurality of logic gates excluding logic gates which requires power at all times, in a power down mode.

Although described later, the power gating control system in accordance with a present embodiment can couple voltage selector switches related to the DVFS and power gating switches related to the zigzag power gating in parallel to each other, based on power rails, thereby preventing a performance reduction which may occur when the voltage selector switches and the power gating switches are coupled in series. As illustrated in FIG. 2, the power gating control system 100 in accordance with a present embodiment may include a mode register 101, a command control circuit 102, a voltage generation circuit 103, a power gating control circuit 104 and logic circuit regions 106-1 to 106-n (BLK1 to BLKn).

The logic circuit regions 106-1 to 106-n may be coupled to a plurality of power rails 105 in common.

The plurality of power rails 105 may include a first power rail 105-1 for providing the first supply voltage VDDH and a second power rail 105-2 for providing the second supply voltage VDDL.

The power gating control system in accordance with a present embodiment may use the first supply voltage VDDH during a high-speed operation or under a high-frequency operation condition, according to the DVFS. On the other hand, the power gating control system may use the second supply voltage VDDL having a lower level than the first supply voltage VDDH, in order to reduce current consumption during a low-speed operation or under a low-frequency operation condition.

The logic circuit region 106-1 may selectively use the first and second supply voltages VDDH and VDDL according to the DVFS, and the supply of the first and second supply voltages VDDH and VDDL may be cut off in the power down mode according to the zigzag power gating.

The logic circuit region 106-1 (BLK1) may include a plurality of logic gates which will be described later, and each of the logic gates may be configured to perform its own function.

The mode register 101 may output one or more code signals CODEi among code signals CODEi stored in advance, according to the command/address signal CA.

The mode register 101 may store bulk bias values as the code signals, for a voltage condition, i.e. each of the first and second supply voltages VDDH and VDDL, the bulk bias values being optimized for threshold voltage control for each operation frequency/logic circuit region through a test performed in advance.

The command control circuit 102 may determine an operation state (active/power down) of the electronic device and the frequency of a clock signal according to the command/address signal CA inputted from outside, and generate control signals CTRL according to the operation state of the electronic device and the frequency of the clock signal.

The command control circuit 102 may transmit the command/address signal CA to the mode register 101, and generate a decoding signal DEC_CODE by decoding a code signal CODEi outputted from the mode register 101.

The voltage generation circuit 103 may generate a plurality of bulk bias voltages Vpbd and Vnbd according to the decoding signal DEC_CODE.

The power gating control circuit 104 may generate voltage select signals SEL_VDD1, SEL_VDD2, ~ and power down signals PDE1, PDE2, ~ which are distinguished for the respective logic circuit regions 106-1 to 106-n, according to the control signals CTRL provided from the command control circuit 102, and select and output bulk bias voltages Vpbd_H1, Vpbd_L1, Vnbd_1, Vpbd_H2, Vpbd_L2, Vnbd_2, ~ which are suitable for the respective logic circuit regions 106-1 to 106-n, among the plurality of bulk bias voltages Vpbd and Vnbd.

Figure 3:
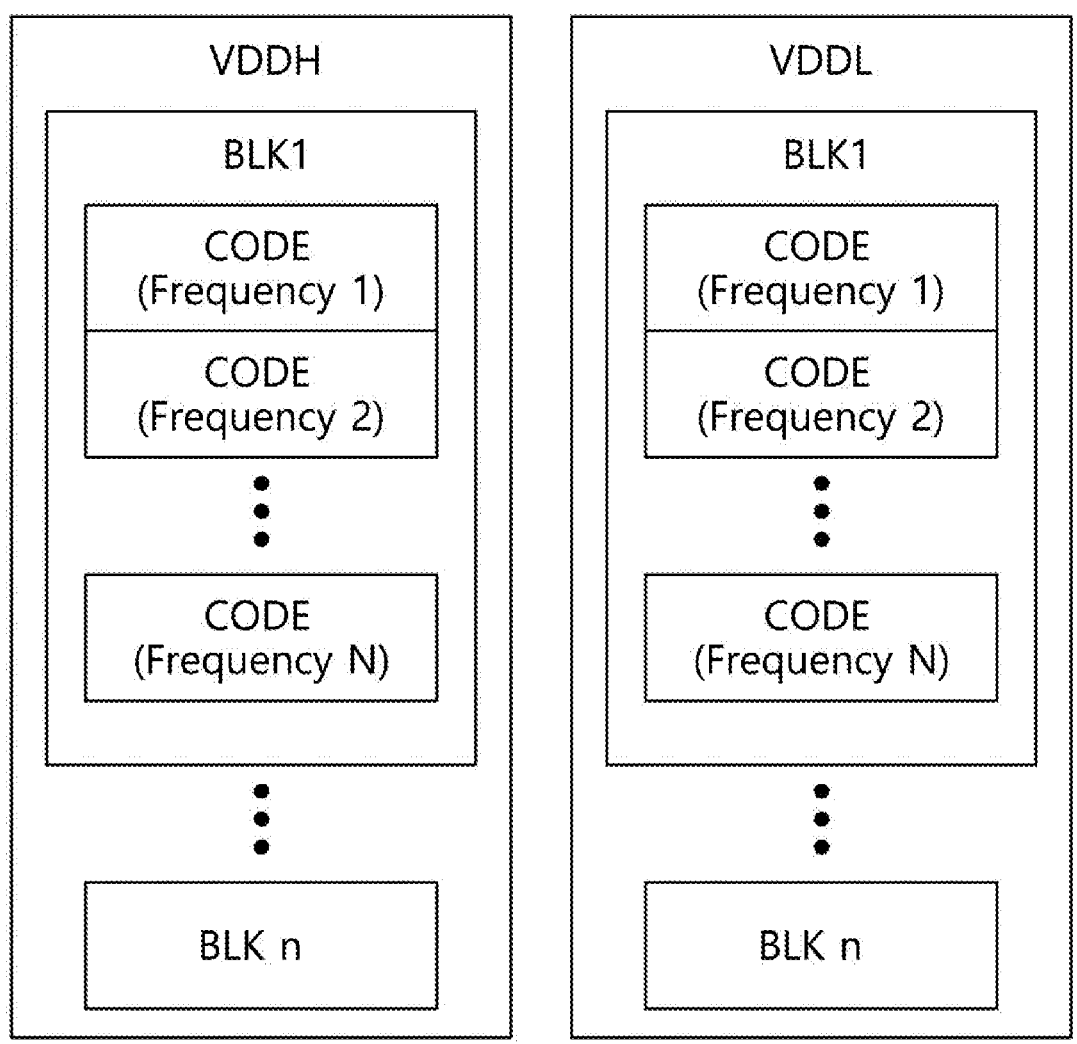
FIG. 3 illustrates the configuration of a mode register of FIG. 2.

FIG. 3 illustrates the configuration of the mode register 101 of FIG. 2.

As illustrated in FIG. 3, the mode register 101 may be divided into a register group related to the first supply voltage VDDH and a register group related to the second supply voltage VDDL, and the bulk bias values optimized for the respective operation frequencies/logic circuit regions through tests performed in advance may be stored as code values in the register groups.

At this time, the bulk bias values optimized for the respective operation frequencies/logic circuit regions may be different from one another. Thus, the corresponding code values may also be different from one another.

Figure 4:
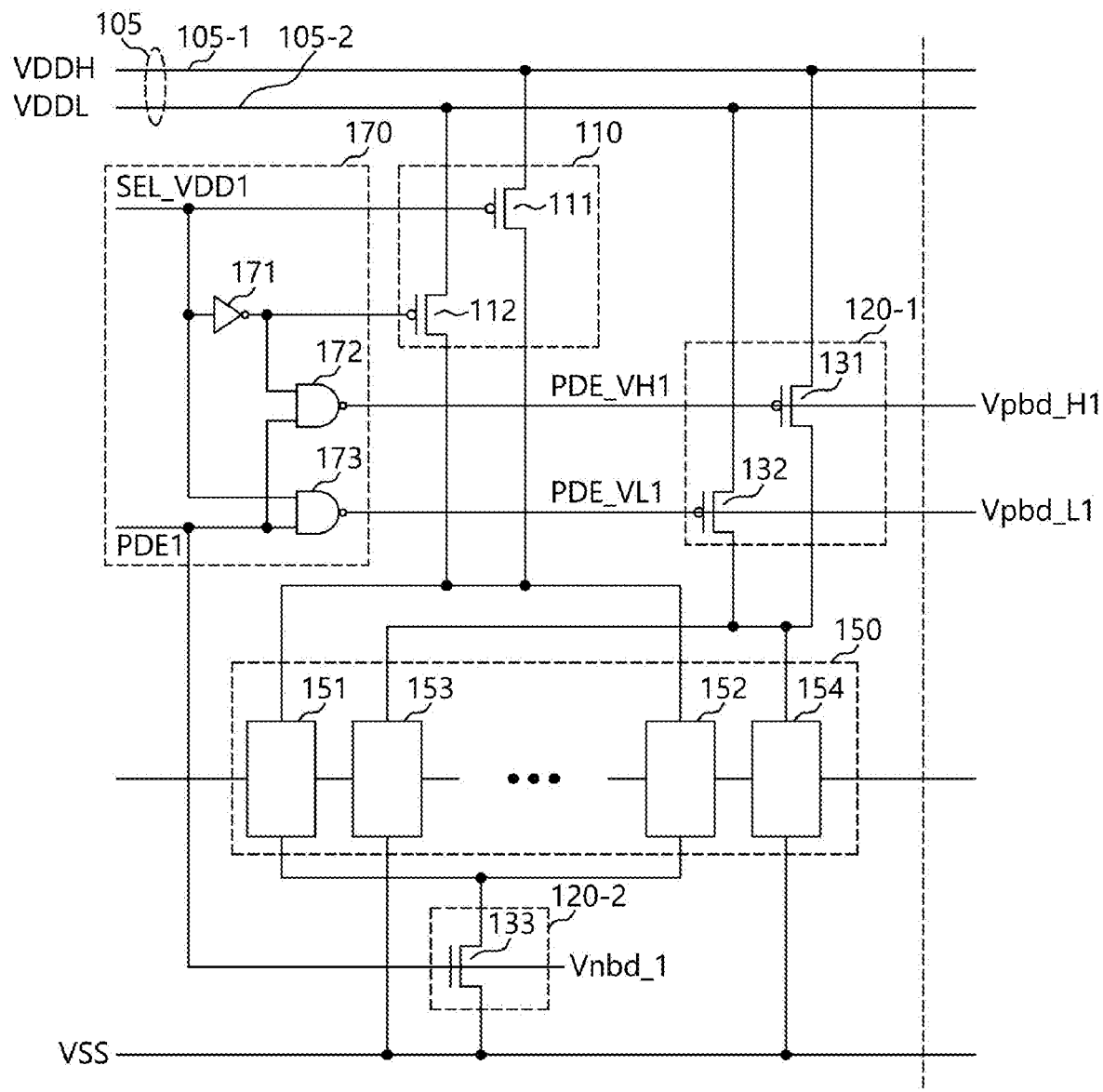
FIG. 4 illustrates the configuration of a logic circuit region of FIG. 2.

FIG. 4 illustrates the configuration of the logic circuit region 106-1 of FIG. 2.

As illustrated in FIG. 4, the logic circuit region 106-1 may include a first switching circuit 120-1 and 120-2, a second switching circuit 110, a logic gate group 150 and a local control circuit 170.

The first switching circuit 120-1 and 120-2 and the second switching circuit 110 may be coupled in parallel to the plurality of power rails 105 (i.e., 105-1 and 105-2).

The first switching circuit 120-1 and 120-2 may cut off the power supply to the logic gate group 150, according to the voltage select signal SEL_VDD1 and the power down signal PDE1, i.e. a power down-mode high-voltage control signal PDE_VH1 and a power down-mode low-voltage control signal PDE_VL1 which are generated according to the voltage select signal SEL_VDD1 and the power down signal PDE1. The first switching circuit 120-1 and 120-2 may be cut off by opening the switches 133, 131, 132, to prevent the power supplies from being received through the first switching circuit 120-1 and 120-2 by the logic gate group 150.

The first switching circuit 120-1 and 120-2 may include first to third switches 131 to 133. The first switch 131 may be coupled to the first power rail 105-1 to which the first supply voltage VDDH is applied, between the plurality of power rails 105, the second switch 132 may be coupled to the second power rail 105-2 to which the second supply voltage VDDL is applied, and the third switch 133 may be coupled to a ground voltage VSS terminal.

The first switch 131 may include a PMOS transistor having a source coupled to the first power rail 105-1, a drain coupled to the logic gate group 150, and a gate configured to receive the power down-mode high-voltage control signal PDE_VH1.

The bulk bias voltage Vpbd_H1 may be applied to a bulk terminal of the first switch 131.

The second switch 132 may include a PMOS transistor having a source coupled to the second power rail 105-2, a drain coupled to the logic gate group 150, and a gate configured to receive the power down-mode low-voltage control signal PDE_VL1.

The bulk bias voltage Vpbd_L1 may be applied to a bulk terminal of the second switch 132.

The third switch 133 may include an NMOS transistor having a source coupled to the ground voltage VSS terminal, a drain coupled to the logic gate group 150, and a gate configured to receive the power down signal PDE1.

The bulk bias voltage Vnbd_1 may be applied to a bulk terminal of the third switch 133.

The second switching circuit 110 may provide one of the first and second supply voltages VDDH and VDDL to the logic gate group 150 according to the voltage select signal SEL_VDD1.

The second switching circuit 110 may include first and second switches 111 and 112. The first switch 111 may be coupled to the first power rail 105-1 to which the first supply voltage VDDH is applied, between the plurality of power rails 105, and the second switch 112 may be coupled to the second power rail 105-2 to which the second supply voltage VDDL is applied. The second switching circuit 110 may be cut off by opening the switches 111 and 112, to prevent the power supplies from being received through the second switching circuit 110 by the logic gate group 150.

The first switch 111 may include a PMOS transistor having a source coupled to the first power rail 105-1, a drain coupled to the logic gate group 150, and a gate configured to receive the voltage select signal SEL_VDD1.

The second switch 112 may include a PMOS transistor having a source coupled to the second power rail 105-2, a drain coupled to the logic gate group 150, and a gate configured to receive the inverted voltage select signal SEL_VDD1.

The logic gate group 150 may include a plurality of logic gates 151 to 154.

At this time, the plurality of logic gates 151 to 154 may be coupled to the second switching circuit 110 and the first switching circuit 120-1 and 120-2 through the zigzag power gating method.

That is, among the plurality of logic gates 151 to 154, the logic gates 151 and 152 which require power at all times may be coupled to receive power through the second switching circuit 110, and the other logic gates 153 and 154 may be coupled to receive power through the first switching circuit 120-1 and 120-2.

The local control circuit 170 may generate the power down-mode high-voltage control signal PDE_VH1 and the power down-mode low-voltage control signal PDE_VL1 according to the voltage select signal SEL_VDD1 and the power down signal PDE1.

The local control circuit 170 may perform inversion and NAND operations. For example, the local control circuit 170 may include an inverter 171, a first NAND gate 172 and a second NAND gate 173.

The inverter 171 may invert the voltage select signal SEL_VDD1, and output the inverted voltage select signal SEL_VDD1.

The first NAND gate 172 may perform a NAND operation on the output signal of the inverter 171 and the power down signal PDE1, and output the operation result as the power down-mode high-voltage control signal PDE_VH1.

The second NAND gate 173 may perform a NAND operation on the voltage select signal SEL_VDD1 and the power down signal PDE1, and output the operation result as the power down-mode low-voltage control signal PDE_VL1.

Hereafter, the operation of the power gating control system in accordance with a present embodiment will be described.

At this time, since the logic circuit regions 106-1 to 106-n can be controlled in a similar manner, the following descriptions will be focused on the logic circuit region 106-1.

The command control circuit 102 may decode the command/address signal CA to determine an operation state (active/power down) of the electronic device and the frequency of the clock signal, and generate the control signals CTRL according to the operation state and the frequency.

The command control circuit 102 may transmit the command/address signal CA to the mode register 101, and generate the decoding signal DEC_CODE by decoding the code signal CODEi outputted from the mode register 101.

For example, suppose that the command/address signal CA defines the active state of the electronic device (for example, data read/write or the like), and the frequency of the clock signal defines a high frequency according to an internally decided reference value.

As described above, the power gating control system in accordance with a present embodiment may use the first supply voltage VDDH during a high-speed operation or under a high-frequency operation condition, according to the DVFS. Under a low-frequency operation condition, however, the power gating control system may use the second supply voltage VDDL having a lower level than the first supply voltage VDDH, in order to reduce current consumption.

Therefore, according to the control signals CTRL provided from the command control circuit 102, the power gating control circuit 104 may output the voltage select signal SEL_VDD1 at a low level and output the power down signal PDE1 at an inactive level, for example, a high level, in order to select the first supply voltage VDDH.

The power gating control circuit 104 may select and output the bulk bias voltages Vpbd_H1, Vpbd_L1 and Vnbd_1 corresponding to the active state/high frequency condition, among the plurality of bulk bias voltages Vpbd and Vnbd, according to the control signals CTRL provided from the command control circuit 102.

Since the voltage select signal SEL_VDD1 is at a low level, the second switching circuit 110 may provide the first supply voltage VDDH to the logic circuit region 106-1.

Furthermore, since the voltage select signal SEL_VDD1 is at a low level and the power down signal PDE1 is at a high level, the local control circuit 170 may output the power down-mode high-voltage control signal PDE_VH1 at a low level, and output the power down-mode low-voltage control signal PDE_VL1 at a high level.

Since the power down-mode high-voltage control signal PDE_VH1 is at a low level and the power down-mode low-voltage control signal PDE_VL1 is at a high level, the first switching circuit 120-1 and 120-2 may provide the first supply voltage VDDH to the logic circuit region 106-1.

The logic circuit region 106-1 may perform its own functions according to the first supply voltage VDDH.

Furthermore, suppose that the command signal CMD defines the active state of the electronic device, and the frequency of the clock signal defines a low frequency according to the internally decided reference value.

According to the control signals CTRL provided from the command control circuit 102, the power gating control circuit 104 may output the voltage select signal SEL_VDD1 at a high level and output the power down signal PDE1 at a high level, in order to select the second supply voltage VDDL.

Furthermore, the power gating control circuit 104 may select and output the bulk bias voltages Vpbd_H1, Vpbd_L1 and Vnbd_1 corresponding to the active state/low frequency condition, among the plurality of bulk bias voltages Vpbd and Vnbd, according to the control signals CTRL provided from the command control circuit 102.

Since the voltage select signal SEL_VDD1 is at a high level, the second switching circuit 110 may provide the second supply voltage VDDL to the logic circuit region 106-1.

Furthermore, since the voltage select signal SEL_VDD1 is at a high level and the power down signal PDE1 is at a high level, the local control circuit 170 may output the power down-mode high-voltage control signal PDE_VH1 at a high level, and output the power down-mode low-voltage control signal PDE_VL1 at a low level.

Since the power down-mode high-voltage control signal PDE_VH1 is at a high level and the power down-mode low-voltage control signal PDE_VL1 is at a low level, the first switching circuit 120-1 and 120-2 may provide the second supply voltage VDDL to the logic circuit region 106-1.

The logic circuit region 106-1 may perform its own functions according to the second supply voltage VDDL.

Since the logic circuit region 106-1 operates according to the second supply voltage VDDL having a lower level than the first supply voltage VDDH, the current consumption can be reduced.

Furthermore, suppose that the command/address signal CA defines the power-down state of the electronic device, and the frequency of the clock signal defines a low frequency according to the internally decided reference value.

According to the control signals CTRL provided from the command control circuit 102, the power gating control circuit 104 may output the voltage select signal SEL_VDD1 at a high level and output the power down signal PDE1 at an active level, i.e. a low level, in order to select the second supply voltage VDDL.

Furthermore, the power gating control circuit 104 may select and output the bulk bias voltages Vpbd_H1, Vpbd_L1 and Vnbd_1 corresponding to the power-down state/low frequency condition, among the plurality of bulk bias voltages Vpbd and Vnbd, according to the control signals CTRL provided from the command control circuit 102.

Since the voltage select signal SEL_VDD1 is at a high level, the second switching circuit 110 may provide the second supply voltage VDDL to the logic circuit region 106-1.

Since the power down signal PDE1 is at a low level, the local control circuit 170 may output both of the power down-mode high-voltage control signal PDE_VH1 and the power down-mode low-voltage control signal PDE_VL1 at a high level, regardless of the level of the voltage select signal SEL_VDD1.

Since both of the power down-mode high-voltage control signal PDE_VH1 and the power down-mode low-voltage control signal PDE_VL1 are at a high level, the first switching circuit 120-1 and 120-2 can cut off the power supply to the logic circuit region 106-1.

Among the logic gates 151 to 154 of the logic circuit region 106-1, only the logic gates 151 and 152 to which the second supply voltage VDDL is supplied can perform their own functions according to the second supply voltage VDDL.

The threshold voltages of the transistors of the second switching circuit 110 and the first switching circuit 120-1 and 120-2 may be controlled by the bulk bias voltages Vpbd_H1, Vpbd_L1 and Vnbd_1 optimized for the power down state/low frequency condition, which makes it possible to minimize a leakage current.

Therefore, the power gating control system in accordance with a present embodiment can use the second supply voltage VDDL having a low level through the DVFS operation under the power down mode/low frequency condition, thereby primarily reducing the current consumption of the logic circuit regions 106-1 to 106-n. Furthermore, the power gating control system can cut off the power supply in the power down state through the power gating operation, thereby reducing the current consumption of the logic circuit regions 106-1 to 106-n.

Furthermore, the power gating control system can minimize a leakage current in the power down state through the bulk bias voltage control, thereby further reducing the current consumption.

Figure 5:
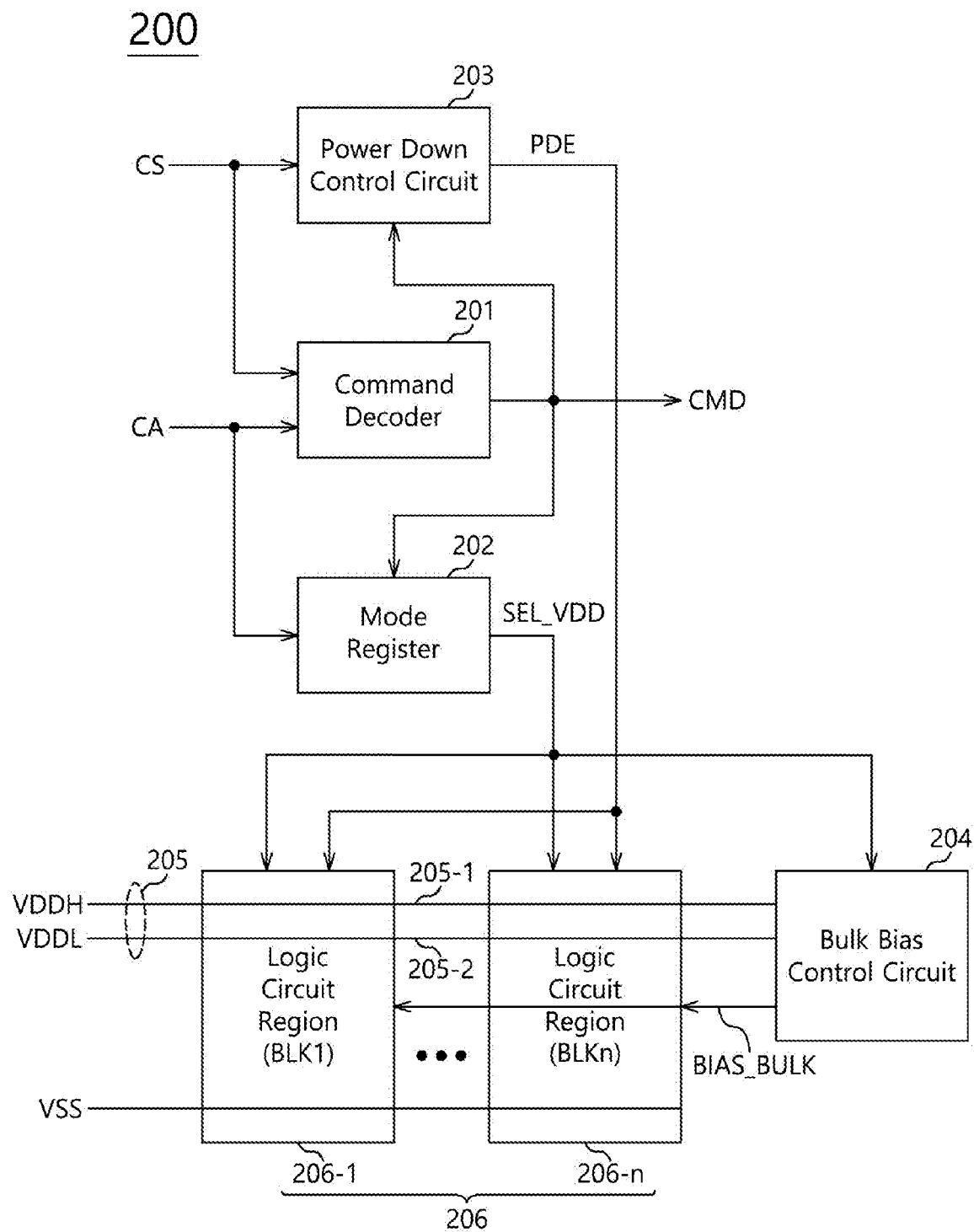
FIG. 5 illustrates the configuration of a power gating control system in accordance with other embodiments.

FIG. 5 illustrates the configuration of a power gating control system 200 in accordance with other embodiments.

The power gating control system 200 in accordance with a present embodiment may be applied to a header only power gating method.

The header only power gating method may indicate a power management method that controls only the supply of a supply voltage between the supply voltage and a ground voltage which are applied to logic circuits of an electronic system, according to an operation speed (frequency) and a power down mode, and does not control the supply of the ground voltage.

As illustrated in FIG. 5, the power gating control system 200 in accordance with a present embodiment may include a command decoder 201, a mode register 202, a power down control circuit 203, a bulk bias control circuit 204 and logic circuit regions 206, 206-1 to 206-n (BLK1 to BLKn).

The logic circuit regions 206-1 to 206-n may be coupled to a plurality of power rails 205 in common.

The plurality of power rails 205 may include a first power rail 205-1 for providing a first supply voltage VDDH and a second power rail 205-2 for providing a second supply voltage VDDL.

The logic circuit region 206-1 (BLK1) may include a plurality of logic gates which will be described later, and each of the logic gates may be configured to perform its own functions.

The command decoder 201 may generate an internal operation command CMD by decoding a chip select signal CS and a command/address signal CA.

The internal operation command CMD may include a read command, write command, mode register read/write command and the like.

The mode register 202 may generate a voltage select signal SEL_VDD according to the command/address signal CA and the internal operation command CMD.

When the memory 20 is set to a high-speed operation mode, the mode register 202 may generate the voltage select signal SEL_VDD at a low level according to the command/address signal CA and the internal operation command CMD which have a value corresponding to the high-speed operation mode.

When the memory 20 is set to a low speed operation mode, the mode register 202 may generate the voltage select signal SEL_VDD at a high level according to the command/address signal CA and the internal operation command CMD which have a value corresponding to the low speed operation mode.

The power down control circuit 203 may control the memory 20 to enter the power down mode by activating the power down signal PDE to a low level according to the internal operation command CMD and the chip select signal CS.

When a transition of the chip select signal CS occurs in the power down mode, the power down control circuit 203 may deactivate the power down signal PDE to a high level, such that the memory 20 escapes from the power down mode or enters a normal mode.

The power gating control system 200 in accordance with a present embodiment may include a second switching circuit, i.e. the bulk bias control circuit 204 for minimizing a leakage current by controlling the voltage levels of the bulk terminals of logic gates in a logic gate group 210.

The bulk bias control circuit 204 may provide any one of the first and second supply voltages VDDH and VDDL as a bulk bias BIAS_BULK to the bulk terminals of the logic gates 211 and 212 (see FIG. 6) of the logic gate group 210 according to the voltage select signal SEL_VDD, regardless of the power down signal PDE.

Figure 6:
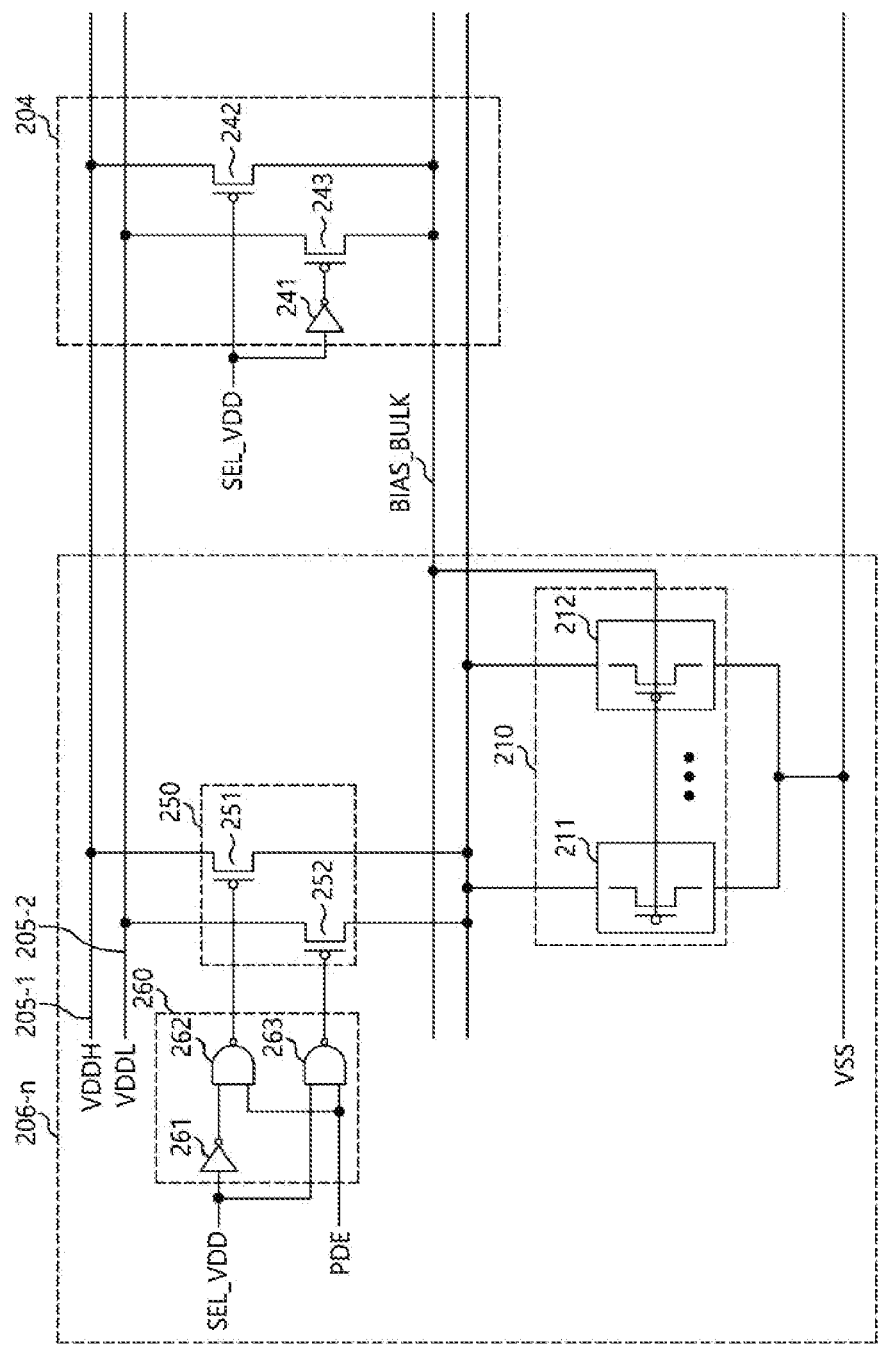
FIG. 6 illustrates the configuration of a logic circuit region and a bulk bias control circuit in FIG. 5.

FIG. 6 illustrates the configuration of the logic circuit region 206-*n* and the bulk bias control circuit 204 in FIG. 5.

As illustrated in FIG. 6, the logic circuit region 206-*n* may include a switching circuit 250, a switching control circuit 260 and the logic gate group 210.

The switching circuit 250 may include first and second switches 251 and 252. The first switch 251 may be coupled to a first power rail 205-1 to which the first supply voltage VDDH is applied, between the plurality of power rails 205-1 and 205-1, and the second switch 112 may be coupled to a second power rail 205-2 to which the second supply voltage VDDL is applied.

The first switch 251 may include a PMOS transistor having a source coupled to the first power rail 205-1 and a drain coupled to the logic gate group 210.

The second switch 252 may include a PMOS transistor having a source coupled to the second power rail 205-2 and a drain coupled to the logic gate group 210.

The switching control circuit 260 may control the switching circuit 250 according to the voltage select signal SEL_VDD and the power down signal PDE, such that any one of the first and second supply voltages VDDH and VDDL is provided to the logic gate group 210 or the first and second supply voltages VDDH and VDDL are blocked from being supplied to the logic gate group 210.

The switching control circuit 260 may perform an inversion operation and a NAND operation. For example, the switching control circuit 260 may include an inverter 261, a first NAND gate 262 and a second NAND gate 263.

The inverter 261 may invert the voltage select signal SEL_VDD, and output the inverted signal.

The first NAND gate 262 may perform a NAND operation on the output signal of the inverter 261 and the power down signal PDE1, and output the operation result to the first switch 251.

The second NAND gate 263 may perform a NAND operation on the voltage select signal SEL_VDD and the power down signal PDE, and output the operation result to the gate of the second switch 252.

The bulk bias control circuit 204 may include an inverter 241 and first and second switches 242 and 243. The first switch 242 may be coupled to the first power rail 205-1 to which the first supply voltage VDDH is applied, between the plurality of power rails 205-1 and 205-1, and the second switch 243 may be coupled to the second power rail 205-2 to which the second supply voltage VDDL is applied.

The first switch 242 may include a PMOS transistor having a source coupled to the first power rail 205-1 and a drain configured to output a bulk bias BIAS_BULK.

The second switch 243 may include a PMOS transistor having a source coupled to the second power rail 205-2 and a drain configured to output the bulk bias BIAS_BULK.

The logic gate group 210 may include a plurality of logic gates 211 and 212.

The logic gate group 210 may indirectly receive the first or second supply voltage VDDH or VDDL through the switching circuit 250, and the header only power gating method in which the logic gates are directly coupled to the ground voltage VSS line may be applied to the logic gate group 210. The bulk bias BIAS_BULK provided from the bulk bias control circuit 204 may be inputted to the bulk terminals of the plurality of logic gates 211 and 212 in the logic gate group 210.

Hereafter, the operation of the power gating control system of FIGS. 5 and 6 in accordance with a present embodiment will be described.

At this time, since the logic circuit regions 206-1 to 206-*n* can be controlled in a similar manner, the following descriptions will be focused on the logic circuit region 206-*n*.

The command decoder 201 may decode the chip select signal CS and the command/address signal CA to determine the operation state (active/power down) of the electronic device and the frequency of the clock signal, and generate the control signals CTRL according to the operation state of the electronic device and the frequency of the clock signal.

For example, suppose that the command/address signal CA defines an active state of the electronic device (for example, data read/write or the like), and the frequency of the clock signal defines a high frequency according to an internally decided reference value.

As described above, the power gating control system in accordance with a present embodiment may use the first supply voltage VDDH during a high-speed operation or under a high-frequency operation condition. Under a low-frequency operation condition, however, the power gating control system may use the second supply voltage VDDL having a lower level than the first supply voltage VDDH, in order to reduce current consumption.

According to the internal command signal CMD and the command/address signal CA which are provided from the command decoder 201, the mode register 202 may output the voltage select signal SEL_VDD at a low level, in order to select the first supply voltage VDDH.

Since the electronic device is activated, the power down control circuit 203 may output the power down signal PDE at an inactive level, for example, a high level.

Since the voltage select signal SEL_VDD is at a low level and the power down signal PDE is at a high level, the first supply voltage VDDH may be provided to the logic circuit region 206-*n*.

The logic circuit region 206-*n* may perform its own functions according to the first supply voltage VDDH.

Since the voltage select signal SEL_VDD is at a low level, the bulk bias control circuit 204 may provide the first supply voltage VDDH to the bulk terminals of the logic gates 211 and 212 in the logic circuit region 206-*n*.

Furthermore, suppose that the command signal CMD defines the active state of the electronic device, and the frequency of the clock signal defines a low frequency according to the internally decided reference value.

According to the internal command signal CMD and the command/address signal CA which are provided from the command decoder 201, the mode register 202 may output the voltage select signal SEL_VDD at a high level, in order to select the second supply voltage VDDL.

Since the electronic device is activated, the power down control circuit 203 may output the power down signal PDE at an inactive level, for example, a high level.

Since the voltage select signal SEL_VDD is at a high level and the power down signal PDE is at a high level, the second supply voltage VDDL may be provided to the logic circuit region 206-*n*.

The logic circuit region 206-*n* may perform its own functions according to the second supply voltage VDDL.

Since the voltage select signal SEL_VDD is at a high level, the bulk bias control circuit 204 may provide the second supply voltage VDDL to the bulk terminals of the logic gates 211 and 212 in the logic circuit region 206-*n*.

Furthermore, suppose that the command/address signal CA defines the power down state of the electronic device.

When the electronic device enters the power down state, the mode register 202 may retain the voltage select signal SEL_VDD in the final state, according to the internal command signal CMD and the command/address signal CA which are provided from the command decoder 201. For example, suppose that the voltage select signal SEL_VDD was at a high level before the electronic device enters the power down state.

Since the electronic device is in the power down state, the power down control circuit 203 may output the power down signal PDE at an active level, i.e. a low level.

Since the power down signal PDE is at a low level, the power supply to the logic circuit region 206-*n* may be cut off, regardless of the level of the voltage supply signal SEL_VDD. That is, none of the first and second supply voltages VDDH and VDDL may be provided to the logic circuit region 206-*n*.

Since the voltage select signal SEL_VDD is retained at a high level, the bulk bias control circuit 204 may provide the second supply voltage VDDL to the bulk terminals of the logic gates 211 and 212 of the logic circuit region 206-*n*, regardless of the power down signal PDE, thereby minimizing an occurrence of leakage current in the power down state.

When the electronic device is in the power down state, the power supply to all of the logic circuit regions 206-1 to 206-*n* may be cut off. At this time, when the bulk bias control circuit 204 is not present, the bulk terminals of the logic gates in the logic circuit regions 206-1 to 206-*n* may float, and a leakage current may be caused by the floating of the bulk terminals. In this case, the power gating performance may be degraded.

In a present embodiment, the header only power gating method can be applied to reduce the circuit area for power gating as well as the current consumption. Even when the electronic device is in the power down state, the power gating control system can provide a voltage suitable for the operating condition (high speed/low speed) of the electronic device as a bias through the bulk bias control circuit 204, thereby further increasing the current consumption reduction effect.

While various embodiments have been described above, it will be understood to those skilled in the art that the embodiments described are examples only. Accordingly, the power gating circuit described herein should not be limited based on the described embodiments.

What is claimed is:

1. A power gating circuit comprising:
   a power gating control circuit configured to generate a power down signal and a voltage selection signal;
   a logic gate group;
   a first switching circuit configured to receive the power down signal and the voltage selection signal, provide a first supply voltage to the logic gate group when the power down signal and the voltage select signal have a first combination, provide a second supply voltage to the logic gate group when the power down signal and the voltage select signal have a second combination and cut off the supply of the first and second supply voltages to the logic gate group according to the power down signal; and
   a second switching circuit configured to receive the voltage selection signal, provide the second supply voltage to the logic gate group when the voltage select signal is at a first level and provide the first supply voltage to the logic gate group when the voltage select signal is at a second level,
   wherein the first and second switching circuits are coupled in parallel to a plurality of power rails for providing the first and second supply voltages.

2. The power gating circuit according to claim 1, further comprising a local control circuit configured for the first switching circuit to provide the first supply voltage to the logic gate group when the power down signal is at a first level and the voltage select signal is at a second level, provide the second supply voltage to the logic gate group when the power down signal is at the first level and the voltage select signal is at the first level and cut off the supply of the first and second supply voltages to the logic gate group when the power down signal is at the second level and configured for the second switching circuit to provide the first supply voltage to the logic gate group when the voltage select signal is at the second level and provide the second supply voltage to the logic gate group when the voltage select signal is at the first level.

3. The power gating circuit according to claim 1, wherein the first switching circuit comprises a plurality of transistors, and
   the plurality of transistors have a threshold voltage that is varied according to an operation state of an electronic device to which the power gating circuit is applied.

4. The power gating circuit according to claim 1, wherein the first switching circuit comprises:
   a first switch coupled to the logic gate group and a first power rail to which the first supply voltage is applied, among the plurality of power rails;
   a second switch coupled to the logic gate group and a second power rail to which the second supply voltage is applied; and
   a third switch coupled to a ground terminal and the logic gate group.

5. The power gating circuit according to claim 1, wherein the first switching circuit is coupled to parts of the logic gate group, and
   the second switching circuit is coupled to other parts of the logic gate group different from the parts of the logic gate group.

6. The power gating circuit according to claim 1, wherein the second switching circuit comprises:

a first switch coupled to a first power rail to which the first supply voltage is applied, among the plurality of power rails; and a second switch coupled to a second power rail to which the second supply voltage is applied.

7. A power gating control system comprising:

a logic circuit region configured to receive a power down signal and a voltage select signal, be input a first supply voltage when the power down signal is at a first level and the voltage select signal is at a second level, be input a second supply voltage when the power down signal is at the first level and the voltage select signal is at the first level and comprising logic gates of which threshold voltages are varied according to bulk bias voltages;

a mode register configured to store bulk bias voltages as code signals for the first and second supply voltages, respectively, the bulk bias voltages being optimized for threshold voltage control at operation frequencies;

a command control circuit configured to determine an operation state of an electronic device and a frequency of a clock signal according to a command signal inputted from outside, and generate control signals according to the operation state and the frequency;

a voltage generation circuit configured to generate a plurality of bulk bias voltages according to the code signals; and a power gating control circuit configured to receive the control signals, generate the power down signal and the voltage select signal according to the control signals, select the bulk bias voltages suitable for the logic circuit region among the plurality of bulk bias voltages according to the control signals, and provide the selected bulk bias voltages to the logic circuit region.

8. The power gating control system according to claim 7, wherein the logic circuit region comprises:

a logic gate group;

a first switching circuit configured to provide the first supply voltage to the logic gate group when the power down signal is at the first level and the voltage select signal is at the second level, provide the second supply voltage to the logic gate group when the power down signal is at the first level and the voltage select signal is at the first level and cut off the supply of the first and second supply voltages to the logic gate group when the power down signal is at the second level; and a second switching circuit configured to provide the first supply voltage to the logic gate group when the voltage select signal is at the second level and provide the second supply voltage to the logic gate group when the voltage select signal is at the first level, wherein the first and second switching circuits are coupled in parallel to a plurality of power rails for providing the first and second supply voltages.

9. The power gating control system according to claim 8, further comprising a local control circuit configured to control the first switching circuit through a combination of the power down signal and the voltage select signal.

10. The power gating control system according to claim 8, wherein the first switching circuit comprises a plurality of transistors, and the plurality of transistors have a threshold voltage that is varied according to an operation state of an electronic device to which the power gating circuit is applied.

11. The power gating control system according to claim 8, wherein the first switching circuit comprises:

a first switch coupled to the logic gate group and a first power rail to which the first supply voltage is applied, among the plurality of power rails;

a second switch coupled to the logic gate group and a second power rail to which the second supply voltage is applied; and a third switch coupled to a ground terminal and the logic gate group.

12. The power gating control system according to claim 8, wherein the first switching circuit is coupled to parts of the logic gate group, and the second switching circuit is coupled other parts of the logic gate group different from the parts of the logic gate group.

13. The power gating control system according to claim 8, wherein the second switching circuit comprises:

a first switch coupled to a first power rail to which the first supply voltage is applied, among the plurality of power rails; and a second switch coupled to a second power rail to which the second supply voltage is applied.

14. A power gating circuit comprising:

a mode register configured to generate a voltage select signal;

a power down control circuit configured to generate a power down signal;

a logic gate group;

a switching circuit configured to receive the voltage select signal and the power down signal, provide a first supply voltage to the logic gate group when the power down signal and the voltage select signal have a first combination, provide a second supply voltage to the logic gate group when the power down signal and the voltage select signal have a second combination and cut off the supply of the first and second supply voltages to the logic gate group according to the power down signal; and a bulk bias control circuit configured to receive the voltage select signal, provide the first supply voltage as a bulk bias of the logic gate group when the voltage select signal is at the second level and provide the second supply voltage as the bulk bias of the logic gate group when the voltage select signal is at the first level, wherein the switching circuit and the bulk bias control circuit are coupled in parallel to a plurality of power rails for providing the first and second supply voltages.

15. The power gating circuit according to claim 14, further comprising a switching control circuit configured for the switching circuit to provide the first supply voltage to the logic gate group when the power down signal is at a first level and the voltage select signal is at a second level, provide the second supply voltage to the logic gate group when the power down signal is at the first level and the voltage select signal is at the first level and cut off the supply of the first and second supply voltages to the logic gate group when the power down signal is at the second level.

16. The power gating circuit according to claim 14, wherein the switching circuit comprises:

a first switch coupled to a first power rail to which the first supply voltage is applied, among the plurality of power rails; and a second switch coupled to a second power rail to which the second supply voltage is applied.

17. The power gating circuit according to claim 14, wherein the bulk bias control circuit is coupled to bulk terminals of logic gates of the logic gate group in common.

* * * * *